AUTOMATIC FREQUENCY CONTROL SYSTEM

Filed June 7, 1957

INVENTOR,
ARTHUR R. SILLS.

BY

Harry M. Saragovitz
ATTORNEY

United States Patent Office 2,881,319

Patented Apr. 7, 1959

2,881,319

AUTOMATIC FREQUENCY CONTROL SYSTEM

Arthur R. Sills, Lakewood, N.J., assignor to the United States of America as represented by the Secretary of the Army Application June 7, 1957, Serial No. 664,447

6 Claims. (Cl. 250—36)

Figure 1:
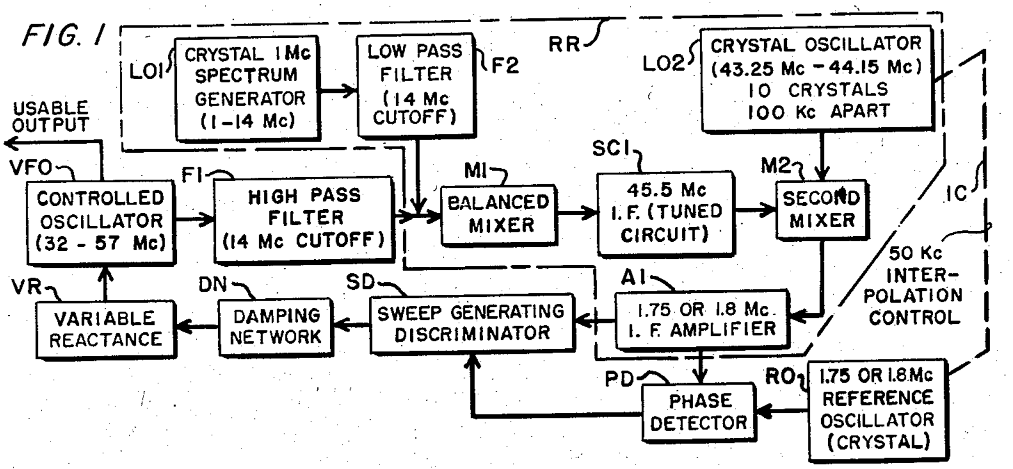

(Granted under Title 35, U. S. Code (1952), sec. 266)

The invention described herein may be manufactured and used by or for the Government for governmental purposes without the payment of any royalty thereon.

The invention relates to automatic frequency control systems and particularly to systems for providing frequency stabilization of oscillation generators and improved sweep generating circuits for use therein.

Examples of oscillation generators requiring such frequency stabilization are the oscillators used for heterodyning purposes in superheterodyne radio receivers and the master oscillators used for exciting oscillations in radio transmitters. The systems of the prior art employed for this purpose usually include a variable reactance, such as a reactance vacuum tube, associated with the frequency determining circuit of the oscillator so that its reactance value determines the frequency of oscillation, and one or more discriminators supplied with voltage waves derived from the output of the oscillator and producing therefrom an error voltage representing by its amplitude and sign the deviation of the oscillator frequency from the desired frequency, which is the mid-frequency to which the discriminator is tuned or that of a stable reference voltage wave also supplied to the discriminator for comparison therein with the derived waves, which error voltage is applied to the reactance tube to vary its reactance to retune the oscillator to the desired frequency.

The use of frequency discriminators or phase discriminators alone for this purpose has been found unsatisfactory in that the former will not provide sufficiently close frequency stabilization, and the latter, while providing more exact frequency control, may allow lock-in at either an upper or lower sideband frequency and will tend to cause extraneous oscillation after synchronization has been effected at one or the other of these frequencies, resulting in undesired frequency modulation of the controlled oscillations. These and other operation difficulties involved in the stabilization of an oscillator over a wide range of frequencies have been reduced to some extent in certain prior art control system by the provision of suitable scanning means for causing the oscillator to sweep the frequency spectrum of interest under the joint control of the voltage output of a frequency and a phase discriminator until a desired relationship between the controlled oscillator frequency and a constant reference frequency is reached, and then to lock in the oscillator at that frequency.

A general object of the invention is to improve automatic frequency control circuits of the last-mentioned general type so as to provide frequency stabilization over a wider frequency error range.

A related object is to produce accurate stabilization of the output of a variable frequency oscillation generator at any desired frequency within a predetermined range.

A more specific object is to extend the capture frequency range of an automatic frequency stabilizing system of the type employing a phase detector for producing the frequency lock-in of the controlled and reference oscillators.

One circuit arrangement in accordance with the invention for attaining these objects includes a conventional phase detector or discriminator with an associated reference oscillator, and a conventional tuned frequency discriminator, having their inputs connected in parallel to the output of a tunable, variable frequency oscillator the frequency of which is to be controlled, through an auxiliary reference receiver of the heterodyne type; and an integrating network and a combined A.-C. and D.-C. coupling network connected between the outputs of these discriminators and the variable reactance controlling the frequency of oscillation of the oscillator. The frequency discriminator with the associated output networks operate under control of the reference receiver to perform the desired functions of sweeping the output of the controlled oscillator back and forth between frequency limits determined by the voltage peaks of the voltage-frequency characteristic curve of that discriminator and the intermediate frequency band-pass characteristic of the reference receiver, until the oscillator output frequency is such that the intermediate frequency produced in the reference receiver and applied to one input of the phase detector is the same as that of the reference wave applied to its other conjugately connected input. Then the phase detector output voltage will take control to lock-in the controlled oscillator at the desired frequency and stop the sweep voltage.

The function of the A.-C. portion of the coupling network is to create the sweep voltage in the straight portion of the discriminator curve, and that of the D.-C. portion is to build up the D.-C. components near the curve peaks where the A.-C. output is low, in the proper polarity to reverse the sweep, and to speed up the return sweep. In other words, the A.-C. component of the discriminator is polarized so as to make the control loop regenerative and oscillate.

The main function of the integrating network is to slow down the sweep rate so that frequency lock-in can occur more reliably.

Figure 2:
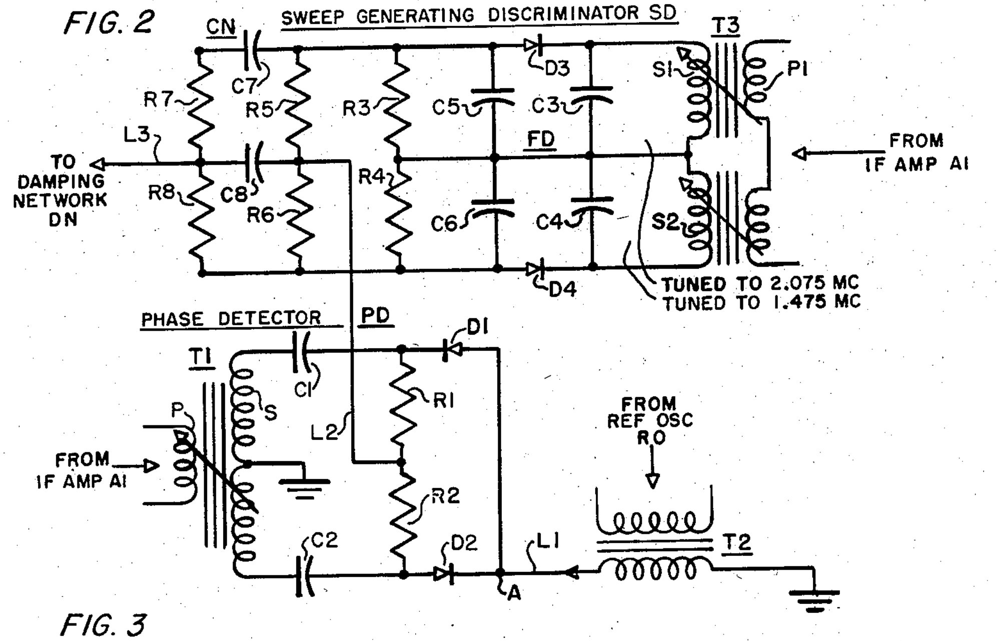
Figure 3:
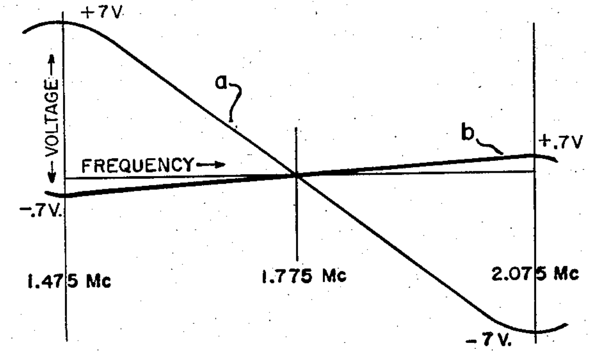

The various objects and features of the invention will be better understood from the following description thereof when read in conjunction with the accompanying drawings in which:

Figure 1 shows in block diagrammatic form an automatic frequency control system embodying the invention;

Figure 2 shows schematically the circuits of a conventional phase detector and frequency discriminator and of the associated output network which in combination with the latter provides the sweep generating discriminator used in the automatic frequency control system of the invention shown in Fig. 1; and Figure 3 is a graph showing the static frequency-voltage characteristics of the frequency discriminator shown in Fig. 2.

Fig. 1 shows one embodiment of the automatic frequency control system of the invention utilized for stabilizing the output of a tunable, variable frequency oscillator VFO at any desired frequency within a wide frequency range, for example, at frequencies 50 kilocycles apart in the frequency range of 32 to 57 megacycles per second, as indicated.

Referring to Fig. 1, the frequency stabilizing circuit includes a reference receiver RR of the double-conversion, superheterodyne type including, as shown within the dot-dash box so labeled, a first (balanced) mixed M1 having its input coupled to one output of the oscillator VFO, for example, to its frequency determining circuit, through the high pass filter F1; a first crystal-controlled local oscillator LO1 having its output connected to the input of mixer M1 through the low-pass filter F2; a first intermediate frequency tuned selecting circuit SC1 in the output of the mixer M1; a second mixer M2 having its input connected to the output of circuit SC1; a second crystal-controlled local oscillator LO2 having its output also connected to the input of the mixer M2; and a tuned intermediate frequency amplifier A1 having its input connected to the output of the mixer M2.

The frequency control system also includes a sweep generating discriminator SD and a phase detector PD the input of the former of which and one input of the latter being connected in parallel to the output of the tuned intermediate frequency amplifier A1; a two-frequency (1.75 or 1.80 megacycles) crystal controlled reference oscillator RO having its output connected to a second input conjugate with respect to the first input referred to above, of the phase detector PD; and a control circuit including the damping network DN, fed from the output of the sweep generating discriminator SD, and from the output of the phase detector PD through a portion of the sweep generating discriminator SD, for controlling the value of the variable reactance VR to adjust the tuning of the variable frequency oscillator VFO.

In order to conserve crystals, preferably only one crystal is used to control the first local oscillator LO1 of the reference receiver RR, which oscillator could be any oscillator adapted to generate a spectrum of frequencies which are integral multiples of a fundamental frequency of one megacycle, up to 14 megacycles, with approximately equal amplitudes. This spectrum of frequencies, 1–14 megacycles, is applied to the input of the mixer M1 through the low-pass filter F2 having a cutoff frequency of 14 megacycles so as to suppress substantially frequencies higher than that frequency appearing in the output of LO1. The high-pass filter F1 having a cutoff of 14 megacycles prevents this spectrum of frequencies from being fed back to contaminate the output of the controlled oscillator VFO, while allowing transmission of the waves generated by that oscillator of frequencies within its range (32 to 57 mc.) to pass from that oscillator to the mixer M1 to beat therein with the spectrum of frequencies supplied by the local oscillator LO1. The selecting circuit SC1 is tuned to a center frequency of 45.5 megacycles so that it will select from the combination products in the output of the mixer a first intermediate frequency signal (45.5 megacycles) when the output of the oscillator VFO is at that frequency or frequencies at every one megacycle interval for 14 megacycles above and below the first IF frequency. This first IF frequency will vary in 50 kc. increments from 45.0 mc. to 45.9 mc. depending upon the selection of the interpolation control. In this system the first IF tuned circuits SC1 are not tuned by the interpolation control. The selected IF signals are transmitted to the input of the second conventional mixer M2.

The crystal-controlled second local oscillator LO2 is adapted to generate and supply to the input of the second mixer M2 for combination therein with the selected first intermediate frequency component received from the selecting circuit SC1, voltage waves of different stable frequencies 100 kilocycles apart in the frequency range of 43.25 to 44.15 megacycles, attained by switching crystals tuned to suitable frequencies in and out of the oscillator circuit, thereby interpolating between the one-megacycle intervals of the intermediate frequency signals supplied to the input of the second mixer M2.

A further interpolation of a 50-kilocycle interval between each 100 kilocycle interval of the oscillator LO2 can be accomplished by ganging the crystal control switches (not shown) of the local oscillator LO2 and the reference oscillator RO, as indicated diagrammatically by the dashed line designated IC, and shifting the second reference frequency between 1.75 and 1.80 megacycles in such manner that the reference frequency is changed twice for each change in the frequency of the crystal-controlled local oscillator LO2 as will be clarified further in the partial table of various frequency combinations given later. This interpolation will enable the number of control crystals used in the local oscillator LO2 to be reduced from 20 to 10 at the expense of a single additional crystal in the reference oscillator RO. Suitable crystal-controlled transistor oscillator circuits for use in the oscillator LO2 and the reference oscillator RO are disclosed in "Transistor Electronics," by Arthur Lo et al.

The second intermediate frequency band centered at the frequency 1.75 or 1.80 megacycles is selected from the combination products in the output of mixer M2 by the tuned input of IF amplifier A1, is amplified by that amplifier and then impressed on the input of the sweep generating discriminator SD and on one input of the phase detector PD.

A phase detector PD and the associated two-frequency (1.75 or 1.80 mc.) crystal-controlled reference oscillator RO are used for the final reference instead of a conventional discriminator because of the much greater correction ratio obtainable with the former, the increased stability of the oscillator as compared to a discriminator and the ease with which the reference oscillator frequency can be shifted. Any conventional phase detector may be used for PD in this system, for example, the double diode type having two A.-C. inputs and one D.-C. output, illustrated schematically in Fig. 2. As shown in that figure, this phase detector includes an input transformer T1 having a primary winding P tuned to the second intermediate frequency signal, connected to the output of the intermediate frequency amplifier A1, and a secondary winding S having its mid-point grounded and its terminals respectively connected in series through the equal capacitors C1 and C2 to the anode of the diode rectifier D1 and the cathode of the diode rectifier D2. A pair of equal resistors R1 and R2 are connected in series directly between the anode of diode D1 and the cathode of diode D2, and the cathode of diode D1 and the anode of diode D2 are connected directly to a common point A to which the grounded lead L1 is connected. The output of the two-frequency reference oscillator RO is coupled by a transformer T2 to the lead L1 so as to be effectively applied to the phase detector PD, between the point A and the grounded mid-point of the secondary winding S of the input transformer T1, in conjugate relation with respect to the input of the phase detector through the input transformer T1 to which the output of the intermediate frequency amplifier A1 is connected. The D.-C. signal output produced in the phase detector PD is taken off by the lead L2 connected to the mid-point between the resistors R1 and R2.

As is well known, such a phase detector will have a balanced output with resultant zero output when there is exact correspondence, both in frequency and phase, between the waves to be compared applied to its two conjugately connected input circuits, and a relative change in phase, no matter how small, between these waves will result in an unbalanced direct current potential in the output of the phase detector which will represent by its sign and magnitude the direction and magnitude of the difference in phase between the two applied waves.

The elements of the phase detector PD, as used in this system, provides a limited catching range, in this case about 50 kilocycles. The holding range is much greater and with the particular variable reactance VR used in the system as built, was approximately 500 kilocycles. A requirement of the system is that it should frequency stabilize the controlled oscillator VFO whenever it is tuned to within 400 kilocycles of a desired frequency. This necessitates some method of sweeping this oscillator through the correct frequency to enable the phase detector PD to gain control. Also, this requires that the tuned intermediate frequency amplifier A1 and associated circuits be designed to provide a second intermediate frequency bandwidth of, say, about 800 kilocycles to enable the sweep generating signal to pass through the system when the controlled oscillator VFO is initially 400 kilocycles off frequency, and that the first intermediate frequency selecting circuit be designed to provide a first IF bandwidth of about 1.8 megacycles to accommodate the one megacycle interpolation plus the ±400 kilocycle sweep generating signal. Also, some method must be used to limit the sweep to insure that the controlled oscillator VFO will not lock at the wrong frequency, usually at a frequency one megacycle removed from the desired one. This incorrect lock is possible because of the 1 mc. spectrum being applied to the first mixer M1, and because the holding range is not easily controlled and could be more than 500 kilocycles. The sweep generating discriminator SD described below provides the above-mentioned characteristics. A conventional frequency discriminator is not applicable to this system to provide the desired sweep of the frequency of the controlled oscillator VFO because the maximum reliable catching range of the phase detector is 50 kc. and it is necessary to shift the reference oscillator RO 50 kc. for interpolation. Since it is undesirable to switch the center frequency of the frequency discriminator in this particular system, it is necessary to arrange the circuitry to cause a sweep from peak to peak to assure that the frequency of the controlled oscillator passes through zero error.

The sweep generating discriminator SD as shown in Fig. 2 comprises one portion FD which is identical with the well-known Travis type of frequency discriminator, such as shown in Fig. 7.7(*a*) on page 303 of vol. 16 of the M.I.T. Radiation Series, first edition (1948), although other conventional frequency discriminators, such as the Foster-Seeley type shown in Fig. 7.7(*b*) of that publication, could be used, and another portion CN in its output consisting of a combined A.-C. and D.-C. coupling network and an associated integrating network connected between FD and the damping network DN.

The portion FD of the sweep generating discriminator SD comprises two separate input transformers having their respective primary windings (P1) connected in series across the output of the intermediate frequency amplifier A1, and respective series-connected, tunable secondary windings S1 and S2 shunted by the capacitors C3 and C4, respectively, to form two resonant circuits respectively tuned to be resonant at a frequency (2.075 mc.) above the crossover frequency (1.775 mc.) and at a frequency (1.475 mc.) below the crossover frequency. The crossover frequency may be defined as that frequency lying between the two output peaks of the discriminator frequency-voltage characteristic curve, for which the output voltage is zero. In this Travis type circuit, the crossover frequency may be shifted by tuning the two resonant circuits in the same direction, while the peak-to-peak separation may be changed by tuning them in the opposite direction. The discriminator frequency-voltage characteristic circuit will be sufficiently symmetrical for this application if the IF amplifier pass-band is symmetrical.

The far terminals of secondary windings S1 and S2 of the input transformer are respectively connected to the anodes of the diodes D3 and D4, and the cathodes of these diodes are connected to each other through the series-connected equal resistors R3 and R4 which are respectively shunted by the equal alternating current, bypass capacitors C5 and C6. As is well known, the frequency discriminator FD as above described will produce a D.-C. error voltage across the resistors R3 and R4 in series, whose polarity depends on whether the IF frequency applied to its input is below or above the crossover frequency, and which is zero at the crossover frequency. The magnitude of this error voltage represents the deviation of the amplitude of the applied IF frequency from the crossover frequency to which the discriminator is tuned.

The network CN as shown in Fig. 1 includes a pair of series-connected resistors R5 and R6 operating as a voltage divider connected directly across the series-connected resistors R3 and R4 in the output of the frequency discriminator portion FD of the sweep generating discriminator SD, so that the output error voltage produced across the latter resistors will be applied thereto. The value (820K) of the resistor R5 is ten times that (82K) of the resistor R6 (and in the model of the sweep generating discriminator which was constructed and tested is approximately of a resistance value six times larger than that of the resistor R3 or R4 in the frequency discriminator FD). The change in voltage drop produced across the large resistor R5 is applied through the capacitor C7 (of value 0.2 $\mu$f.) and the resistor R7 (100K) in series therewith to the lead L3 connecting through the damping network DN to the variable reactance VR controlling the frequency of the controlled oscillator VFO, thereby providing A.-C. coupling between the output of the discriminator FD and that reactance. The resistors R7 and R8 act as a voltage divider in a manner similar to a volume control for controlling the amplitude of the A.C. component applied to the reactance, for optimum hunting action. The capacitor C8 (value .05 $\mu$f.) connected between the lead L3 and the mid-point between the resistors R5 and R6 to which the output lead L2 from the phase detector PD is connected, provides A.-C. coupling between the output of the phase detector and the variable reactance VR. The D.-C. voltage across the resistor R6 (of value 82K) in the voltage divider, produced by the application thereto of the direct output voltage of discriminator FD is applied to the lead L3 leading to the variable reactance circuit VR, by a connection from the lower end of that resistor through resistor R8 (100K) in series therewith. Since the A.-C. voltage applied from the output of FD to the lead L3 is ten times larger than the D.-C. voltage applied thereto, the A.-C. voltage creates the sweep voltage in the straight portion of the discriminator curve, whereas near the peaks, where the A.-C. output is low, the smaller applied D.-C. component builds up in the proper polarity to sweep the frequency in the proper direction. The value of the capacitors C7 (.2 $\mu$f.) and C8 (.05 $\mu$f.) have been selected to provide best operation in this particular application of the automatic frequency control circuit which has been built and tested. Other values may be more suitable for other applications.

Fig. 3 shows the static curves *a* and *b* of the frequency discriminator FD indicating the sweep action in response to the A.-C. and D.-C. components of the discriminator. These curves show the polarities with respect to the lead L2 from the phase detector PD. With these polarities the variable reactance must be polarized to increase frequency when a negative voltage is applied. Referring to Fig. 2, the curve (*a*) of Fig. 3 represents the voltage drop across resistor R5 with lead L2 considered as grounded; and the curve (*b*) represents the voltage drop across R6 with the lead L2 considered as grounded.

The operation of the whole system for controlling the frequency of oscillator VFO will now be briefly described.

If the intermediate frequency signal applied from the output of the tuned intermediate frequency amplifier A1 to the input of the frequency discriminator FD is outside the frequency range to which the discriminator is responsive, no output voltage for the discriminator will be produced and no sweep voltage will be applied to the variable reactance VR. However, because of the spectrum of frequencies from LO1 applied to the first mixer M1, the center frequency of the IF will be produced in increments of 1 mc. of the frequency of VFO. Assuming that the controlled oscillator VFO is tuned to the frequency set up in the reference receiver RR and is not locked, the frequency of the oscillator will change slightly in a random manner. This change will be detected in the sweep discriminator SD which is polarized so that its output voltage causes the frequency to change more in the same direction. This will continue until the peak of the discriminator curve is reached at which time the direction of frequency change will reverse. The frequency will continue to sweep in the other direction until the opposite peak of the discriminator curve is reached and then will be reversed again. The frequency will sweep back and forth between the peaks of the discriminator until the oscillator is stabilized by the phase discriminator PD which happens when the IF frequency produced by the reference receiver RR and applied to one input of the phase detector PD is the same as the reference frequency applied by the reference oscillator RO to its other input, when the phase detector output voltage applied to the variable reactance VR through the network CN and damping network DN is such as to maintain the reactance value of VR constant and to lock the controlled oscillator VFO at that frequency and stop the sweep voltage. Locking will usually occur during the first or second sweep. Once the oscillator VFO is stabilized at any particular frequency, no sweep voltage is present because only a change in frequency is detected by the frequency discriminator FD. The advantages of the sweep circuit as described above are:

(1) The extent of frequency sweep is confined to designed frequency limits by tuned circuits;

(2) No sweep voltage is present when the controlled oscillator is stabilized; and, (3) The sweep does not start until the controlled oscillator is tuned to within the catching range of the discriminator FD.

The operation of the sweep generating discriminator SD for three different situations will now be described in detail.

Consider an initial condition such that the frequency of the controlled oscillator VFO is low and the IF frequency applied to the hunting circuit is 1.475 mc. Referring to Figs. 2 and 3, it can be seen that only a change in voltage across R5 will be coupled out because of capacitor C7, but the D.-C. voltage drop across R6 is applied to the damping network DN through resistor R8. Disregarding the D.-C. component for a moment, it should be understood that there will be no A.-C. component at this point because there is no slope in the characteristic curve. The negative D.-C. component will start the frequency going higher as in a conventional AFC system, and as the frequency increases, the negative D.-C. component decreases as indicated in Fig. 3. As the frequency goes on the slope of curve (*a*), the resulting negative-going A.-C. component causes the oscillator VFO to sweep higher in frequency until it reaches the peak at 2.075 mc. Since this A.-C. component is ten times larger than the D.-C. component, the D.-C. component is unable to hold the frequency in the center, 1.775 mc., but it sweeps from peak to peak. Normally, the phase lock takes hold on the first pass through the center frequency 1.775 mc., so for the purpose of describing the sweeping action, the phase detector PD will be considered as grounded.

If the output frequency of the oscillator VFO falls on the high frequency side of the IF, 2.075 mc., the voltage drop across R3 becomes the source, and all polarities are reversed, causing the controlled oscillator frequency to be swept lower.

If the system is arranged so that the controlled oscillator VFO can be initially tuned so the frequency never falls beyond the straight slope portion of curve (*a*) (Fig. 3), the D.-C. component is not necessary to start sweep action. Assume that the frequency falls somewhere between 1.5 mc. and 1.775 mc., and that, since the controlled oscillator is not locked in, the frequency will drift slightly. Assume again that the frequency drifts lower. Referring to curve (*a*), it will be seen that a positive-going voltage is coupled out, causing the frequency to sweep lower which, in turn, builds up more positive-going voltage. This maintains itself until the 1.475 mc. peak of the characteristic is reached and then reverses. The frequency, now returning to the original setting, causes a negative-going voltage to be coupled out, which, in turn, causes the frequency of the controlled oscillator VFO to increase further until the 2.075 mc. peak is reached. Then the operation will reverse and sweep the frequency back to 1.475 mc.

If the initial frequency drift had been higher instead of lower as described above, the sweep circuit would have maintained the original direction. It does not matter which direction the original drift takes because eventually it sweeps through the center frequency 1.775 mc. However when the D.-C. component is added, the sweep always starts the frequency towards 1.775 mc.

When the controlled oscillator VFO happens to be tuned so that the IF frequency is 1.775 mc., there will be no D.-C. output to initiate the sweep but there will be an A.-C. component created by the oscillator drift. This will initiate a sweep in either direction depending upon the direction of the controlled oscillator frequency drift. Normally, with the phase detector PD in operation, the frequency will be stabilized before the sweep can start when the controlled oscillator is tuned within 50 kc. of the desired frequency.

Other features of the design of the various components of the automatic frequency control system of the invention as described above which will improve its operation are the following:

The variable reactance VR, which may be of the pentode vacuum tube type, should be capable of modulating the oscillator VFO up to at least 50 kilocycles without phase shift to prevent instability in the control loop.

The balanced mixer M2, which may be of the double diode type, should be adjusted so that it attenuates the response when the controlled oscillator VFO is at the first IF frequency because there is no mixing loss at this frequency.

The damping network DN, which may be a simple resistance-capacitance network, is necessary to prevent modulation of the output of the controlled oscillator VFO. It should preferably be designed so as to correct for deficiencies elsewhere in the system by having no attenuation at D.-C. and a maximum attenuation of 40 decibels at 20 kilocycles and above with little phase shift. In the particular damping network used, the maximum phase shift was 75° lagging at 1,000 cycles and the attenuation provided was 20 decibels.

The present scheme does not provide for modulating the system. In order to modulate the output of the controlled oscillator VFO, it would be necessary to modulate the waves produced by the crystal-controlled oscillator LO2 or the reference oscillator RO. This limits the type of modulation used to phase modulation. Frequency modulation can be accomplished if the reference oscillator RO is made free running, but it would require additional circuitry to stabilize. When the frequency control system of the invention is used for stabilizing the frequency of a master oscillator in a radio transmitter, the output of that oscillator must be mixed with that of another oscillator generating a wave of a fixed frequency which can be modulated, to generate the desired carrier frequency. The integrating portion of the output network CN, which is provided by the capacitor C8 and the resistance effectively in series therewith, will prevent response to any modulation in the transmitter application, as well as slow down the sweep rate.

Examples of frequency combinations which could be used in the system of the invention as described above are:

| Desired frequency, mc. | Component of spectrum utilized, mc. | First IF frequency, mc. | Crystal oscillator $LO_2$ frequency, mc. | Second IF frequency, mc. | Reference oscillator RO frequency, mc. |
|---|---|---|---|---|---|
| 33.00 | 12 | 45.00 | 43.25 | 1.75 | 1.75 |
| 33.05 | 12 | 45.05 | 43.25 | 1.80 | 1.80 |
| 33.10 | 12 | 45.10 | 43.35 | 1.75 | 1.75 |
| 33.15 | 12 | 45.15 | 43.35 | 1.80 | 1.80 |
| 33.20 | 12 | 45.20 | 43.45 | 1.75 | 1.75 |
| 33.25 | 12 | 45.25 | 43.45 | 1.80 | 1.80 |
| 33.50 | 12 | 45.50 | 43.75 | 1.75 | 1.75 |
| 33.90 | 12 | 45.90 | 44.15 | 1.75 | 1.75 |
| 33.95 | 12 | 45.95 | 44.15 | 1.80 | 1.80 |
| 34.00 | 11 | 45.00 | 43.25 | 1.75 | 1.75 |
| 45.50 | 0 | 45.50 | 43.75 | 1.75 | 1.75 |
| 55.00 | 10 | 45.00 | 43.25 | 1.75 | 1.75 |
| 57.00 | 12 | 45.00 | 43.25 | 1.75 | 1.75 |

A later developed system utilized second IF frequencies of 5.725 mc. and 5.775 to increase the image rejection capability of the first IF tuned circuits. The frequency stabilizing system of the invention as described above employs a single frequency discriminator with a common network in the output for producing a D.-C. and A.-C. coupling of that discriminator to the variable reactive portion of the circuit to provide the sweeping operation. An equivalent result, of course, could be accomplished with more apparatus by the use of a pair of oppositely-poled, like frequency discriminators controlled from the heterodyned output of the variable frequency oscillator to be controlled, and controlling the reactance value of the reactance tube, one of which discriminators being A.-C. coupled to the reactance tube in such manner as to make the control loop regenerative and the second of which being D.-C. coupled to the reactance tube in conventional AFC fashion and poled so that its output voltage would tend to decrease the frequency error. In this alternative system the A.-C. coupling voltage should be larger than the D.-C. coupling voltage, and the D.-C. discriminator circuit should have a much higher Q than the A.-C. circuit so that it would have no output for small frequency errors. The return sweep due to the action by the A.-C. coupled discriminator alone would be rather slow at the peaks, and the D.-C. discriminator would operate to speed up the return sweep. A phase detector would be used to lock in the controlled oscillator at the desired frequency and stop the sweep when the IF frequency of the heterodyning circuit is the same as the reference frequency generated by a reference oscillator in a manner similar to that described above for the circuit employing a single frequency discriminator.

Other modifications of the circuits illustrated and described which are within the spirit and scope of the invention will occur to persons skilled in the art.

What is claimed is:

1. In combination with a system for stabilizing the output of a variable frequency oscillation generator at any desired frequency within a given range, including a tunable variable reactance the value of which determines the frequency of oscillation of said generator, a reference receiver for heterodyning the output wave of each frequency generated by said generator to derive therefrom the same intermediate frequency signal for each generated frequency, a frequency stable oscillator for producing reference oscillations of said given frequency, a frequency discriminator having a frequency voltage characteristic centered at a frequency which is substantially the same as said given frequency and including two voltage peaks at frequencies respectively a given amount above and below the center frequency, a phase detector having two conjugately-connected inputs and one output circuit, means for applying the derived intermediate frequency signals to the input of said discriminator and to one input of said phase detector and means for applying the reference oscillations of said given frequency to the other input of said detector, said discriminator producing in its output a D.-C. error voltage representing in sign and magnitude the deviation of the applied intermediate frequency signal from the center frequency of the discriminator and said detector producing in its output circuit a D.-C. voltage proportional to the difference in phase between the waves applied to its two inputs: means comprising a resistor-capacitor network in the outputs of said frequency discriminator and said phase detector for converting the D.-C. voltage outputs thereof into other proportional voltages having both A.-C. and D.-C. components, a control loop for applying the converted voltage output of said discriminator to said variable reactance to control its tuning so that the output frequency of said generator is swept back and forth over a frequency range mainly determined by the frequency difference between the two voltage peaks of the discriminator characteristic and means to apply the converted voltage of said detector over said loop to said variable reactance with such poling that when the means frequency of the derived intermediate frequency signal becomes the same as said given frequency the tuning of said variable reactance is made such as to lock-in said generator at the frequency to which it is tuned at the time and to stop the sweep voltage.

2. The system of claim 1, in which the resistor and capacitor elements of the network in said converting means are arranged and relatively proportioned so that the A.-C. component of the converted voltage output of said frequency discriminator applied to said loop is substantially greater than the D.-C. component applied thereto with the result that said A.-C. component by making the control loop oscillate regeneratively creates the sweep voltage in the straight portion of the discriminator characteristic and the D.-C. component of lower voltage value operates to speed up the action near the two peaks of the characteristic where the A.-C. output is low, and to build up in the proper polarity to reverse the sweep.

3. The system of claim 1, in which integrating means comprising capacitance and the resistance effectively in series therewith is inserted in the control loop in front of said variable reactance, the function of which is to slow down the sweep rate so that frequency lock-in may occur more reliably.

4. The system of claim 1, in which a damping network is inserted in the control loop between said converting means and said variable reactance, the main function of which is to prevent modulation of the controlled generator caused by control loop instability.

5. The system of claim 1, in which the frequency limits of the sweep is in part determined by the band-pass characteristics of said reference receiver.

6. The combination of claim 1, in which said network includes one pair of series-connected resistors, operating as a voltage divider, connected across the output of said discriminator, for applying the D.-C. output error voltage of that discriminator directly thereto, the mid-point between the two resistors in said one pair being connected directly to the output of said phase detector so that the D.-C. output voltage of the detector is applied directly to that point, the resistance value of one of the resistors in said one pair being substantially greater than that of the other resistor in said one pair, a first capacitor and a second pair of resistors equal in resistance value connected in series across said one pair of resistors, a direct connection from the mid-point between the resistors in said second pair to said control loop, a second capacitor connected directly between the mid-points between the resistors in said one and said second pairs, a fifth resistor and a direct connection through said fifth resistor between the lower end of said other resistor of lower resistance value in said one pair and the mid-point between the resistors in said second pair, the voltage drop produced in said one resistor of larger resistance value in said one pair in response to the D.-C. voltage output of said discriminator being applied through said first capacitor to said control loop to provide A.-C. coupling between the output of the discriminator and said reactance, the resistors in said second pair operating as a voltage divider to control the amplitude value of the A.-C. component applied to said reactance, said second capacitor providing A.-C. coupling between the output of said phase detector and said reactance, the voltage drop produced in said other resistor of larger value in said one pair by the application thereto of the D.-C. voltage output of said discriminator being applied directly to said control loop through said fifth resistor.

References Cited in the file of this patent

UNITED STATES PATENTS

| | | |
|---|---|---|
| 2,610,297 | Leed | Sept. 9, 1952 |
| 2,685,032 | Cox | July 27, 1954 |
| 2,810,832 | Broodhead | Oct. 22, 1957 |